(12) United States Patent
Chen et al.

(10) Patent No.: US 10,706,942 B2
(45) Date of Patent: Jul. 7, 2020

(54) BACKUP POWER CIRCUIT AND ELECTRICAL DEVICE

(71) Applicant: HUAWEI TECHNOLOGIES CO., LTD., Shenzhen, Guangdong (CN)

(72) Inventors: Guan Chen, Chengdu (CN); Xiao Yu, Shenzhen (CN); Debo Wang, Chengdu (CN)

(73) Assignee: HUAWEI TECHNOLOGIES CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/146,946

(22) Filed: Sep. 28, 2018

(65) Prior Publication Data

US 2019/0035479 A1    Jan. 31, 2019

Related U.S. Application Data

(63) Continuation of application No. PCT/CN2017/077865, filed on Mar. 23, 2017.

(30) Foreign Application Priority Data

Mar. 31, 2016  (CN) .......................... 2016 1 0199983

(51) Int. Cl.
   *G11C 16/30*     (2006.01)
   *G11C 5/14*      (2006.01)
   *G06F 1/30*      (2006.01)
(52) U.S. Cl.
   CPC ............. *G11C 16/30* (2013.01); *G06F 1/30* (2013.01); *G11C 5/141* (2013.01)

(58) Field of Classification Search
   CPC ................................ G11C 16/30; G11C 5/141
   See application file for complete search history.

(56) References Cited

U.S. PATENT DOCUMENTS

| 7,474,304 B2* | 1/2009 | Lee ...................... G09G 3/3696 345/204 |
| 7,973,430 B2* | 7/2011 | Park ........................ G09G 3/20 307/154 |
| 9,742,220 B2* | 8/2017 | Jeon ........................ H02J 9/061 |
| 2008/0164760 A1 | 7/2008 | Hattori |
| 2010/0329064 A1 | 12/2010 | Wilson |

(Continued)

FOREIGN PATENT DOCUMENTS

| CN | 101625873 A | 1/2010 |
| CN | 201576244 U | 9/2010 |

(Continued)

*Primary Examiner* — Tri M Hoang
(74) *Attorney, Agent, or Firm* — Womble Bond Dickinson (US) LLP

(57) ABSTRACT

A backup power circuit is provided. The backup power circuit includes a backup power branch array that includes N backup power branches that are coupled in parallel; and each backup power branch include a capacitor component and a unilateral conductive element, where the unilateral conductive element is configured to cut off a current path between capacitor components in the N backup power branches that are coupled in parallel, so that when some backup power branches are short-circuited, it can be ensured that backup power functions of other backup power branches are not affected, and backup power effects of the backup power branches are improved.

17 Claims, 4 Drawing Sheets

(56) References Cited

U.S. PATENT DOCUMENTS

| | | | |
|---|---|---|---|
| 2012/0117409 A1 | 5/2012 | Lee et al. | |
| 2013/0020880 A1* | 1/2013 | Asai | H02J 7/34 307/109 |
| 2014/0152379 A1* | 6/2014 | Fujimoto | H02M 3/073 327/536 |
| 2015/0102668 A1* | 4/2015 | Jeon | H02J 9/061 307/23 |

FOREIGN PATENT DOCUMENTS

| | | |
|---|---|---|
| CN | 102097948 A | 6/2011 |
| CN | 102156679 A | 8/2011 |
| CN | 203133742 U | 8/2013 |
| CN | 204615435 U | 9/2015 |
| CN | 204859623 U | 12/2015 |
| CN | 105279109 A | 1/2016 |
| CN | 105867573 A | 8/2016 |
| DE | 3023190 A1 | 1/1982 |
| DE | 102011109111 A1 | 2/2013 |
| JP | S60140413 A | 7/1985 |
| JP | 03-251045 A | 11/1991 |

\* cited by examiner

BACKUP POWER CIRCUIT AND ELECTRICAL DEVICE

CROSS-REFERENCE TO RELATED APPLICATIONS

This application is a continuation of International Application No. PCT/CN2017/077865, filed on Mar. 23, 2017, which claims priority to Chinese Patent Application No. 201610199983.5, filed on Mar. 31, 2016. The disclosures of the aforementioned applications are hereby incorporated by reference in their entireties.

TECHNICAL FIELD

The present application relates to the field of backup power technologies, and in particular, to a backup power circuit and an electrical device.

BACKGROUND

In a storage device, a solid-state drive (SSD) is a new-type storage device that is based on a semiconductor solid-state memory technology. The SSD has advantages, such as a high read/write speed, high shock resistance, a large temperature range, a small volume, and a light weight, over a conventional mechanical hard disk.

In general, a write operation performed by a host device on the SSD has two modes: a write-through mode and a write-back mode. A speed of the write-back mode is typically higher than that of the write-through mode. However, in the write-back mode, the SSD first writes data in a buffer of the SSD, and then returns a message indicating a write success to the host device, and the host device considers that the SSD has completed data storage. Then, a main control chip of the SSD flushes the data to a back-end flash memory chip of the SSD. If a platter of the SSD is powered off in this case, data in the buffer will be lost. Therefore, in SSD design, usually a backup power circuit is added. The backup power circuit includes some capacitors that are coupled in parallel. One end of each of the some capacitors is coupled between an input end and an output end of the backup power circuit, and the other end is grounded. The backup power circuit is used to provide the SSD with the electric energy required, when unexpected power-off occurs, for flushing the data in the buffer to the flash memory chip, so as to avoid a data loss.

However, because the capacitors in the backup power circuit are coupled in parallel, if one of the capacitors is short-circuited, the entire backup power circuit fails, thereby affecting a backup power effect of the backup power circuit.

SUMMARY

Throughout the specification, and in the claims, the term "coupled" means a direct electrical connection between the things that are coupled, without any intermediary devices. The term "coupled" means either a direct electrical connection between the things that are coupled, or an indirect connection through one or more passive or active intermediary devices.

To improve a backup power effect of a backup power circuit, embodiments of the present application provide a backup power circuit and an electrical device. The technical solutions are as follows:

According to a first aspect, a backup power circuit is provided, where an output end of the backup power circuit is electrically coupled to an input end of a power supply circuit of an electrical device, an input end of the backup power circuit is coupled to an output end of the power supply circuit, the backup power circuit includes a backup power branch array including N backup power branches that are coupled in parallel, N is an integer greater than or equal to 2, and each backup power branch includes a capacitor component and a unilateral conductive element;

the unilateral conductive element is electrically coupled to an input end of the backup power branch array, an output end of the backup power branch array, and the capacitor component separately; and the unilateral conductive element is configured to cut off a current path between the N backup power branches that are coupled in parallel, and the unilateral conductive element allows a current to flow into the input end of the backup power branch array and flow out from the output end of the backup power branch array.

The backup power branch array including the N backup power branches that are coupled in parallel is disposed, and in each backup power branch array, a current path between capacitor components in different backup power branches is cut off using the unilateral conductive element. When some backup power branches are short-circuited, it can be ensured that backup power functions of other backup power branches are not affected, so that backup power effects of the backup power branches are improved.

In one embodiment, the unilateral conductive element includes a first diode and a second diode; a negative electrode of the first diode is electrically coupled to a positive electrode of the second diode, a positive electrode of the first diode is electrically coupled to the input end of the backup power branch array, and a negative electrode of the second diode is electrically coupled to the output end of the backup power branch array; and the capacitor component includes M capacitors that are coupled in parallel, one end of each capacitor is coupled between the negative electrode of the first diode and the positive electrode of the second diode, the other end of each capacitor is grounded, and M is an integer greater than or equal to 1.

A current path between different backup power branches is cut off using the first diode and the second diode, so that when some backup power branches are short-circuited, backup power effects of other backup power branches are not affected.

In one embodiment, a capacitance of each capacitor is Cmin, and Cmin satisfies $Cmin*M*(N-x)*(Vmax-Vmin) \geq Q$, where x is an integer greater than or equal to 1, Vmax is a maximum discharge voltage of the backup power branch array, Vmin is a minimum discharge voltage of the backup power branch array, and Q is a quantity of electric charges required for effectively supplying power to the storage device for preset duration.

In one embodiment, each backup power branch further includes a resistor, one end of the resistor is electrically coupled to the negative electrode of the first diode, and the other end of the resistor is electrically coupled to the positive electrode of the second diode; and one end of each capacitor is coupled between the resistor and the positive electrode of the second diode.

The resistor is disposed in the backup power branch to limit a value of a current of the backup power branch when the capacitor in the backup power branch is short-circuited, so that another backup power branch can obtain a sufficient current for charging, thereby mitigating impact of a short circuit of some of backup power branches on the other backup power branches.

In one embodiment, a resistance R of the resistor satisfies:

$(Vcap/R)*N<A0-A1$, where

Vcap is a charge voltage of the N backup power branches that are coupled in parallel, A0 is a maximum charge current of the backup power circuit, and A1 is a preset current value.

In one embodiment, the backup power circuit further includes a third diode; and the third diode is coupled to the backup power branch array in parallel, where a positive electrode of the third diode is electrically coupled to the input end of the backup power branch array, and a negative electrode of the third diode is electrically coupled to the output end of the backup power branch array.

In one embodiment, the backup power circuit further includes a constant current source;

the constant current source includes an input end, an output end, and a control end;

the input end of the constant current source is electrically coupled to the output end of the backup power branch array;

the output end of the constant current source is grounded; and the control end of the constant current source is electrically coupled to the control chip.

In one embodiment, each of the M capacitors that are coupled in parallel is at least one of an electrolytic aluminum capacitor, a polymer solid tantalum capacitor, a polymer solid aluminum capacitor, or a ceramic capacitor.

According to a second aspect, an electrical device is provided, where the electrical device includes the backup power circuit according to any one of the first aspect, or embodiments of the first aspect.

In one embodiment, the electrical device is a storage device.

BRIEF DESCRIPTION OF DRAWINGS

To describe the technical solutions in the embodiments of the present application more clearly, the following briefly describes the accompanying drawings required for describing the embodiments. Apparently, the accompanying drawings in the following description show merely some embodiments of the present application, and a person of ordinary skill in the art may still derive other drawings from these accompanying drawings without creative efforts.

DESCRIPTION OF EMBODIMENTS

To make the objectives, technical solutions, and advantages of the present application clearer, the following further describes the embodiments of the present application in detail with reference to the accompanying drawings.

Figure 1:
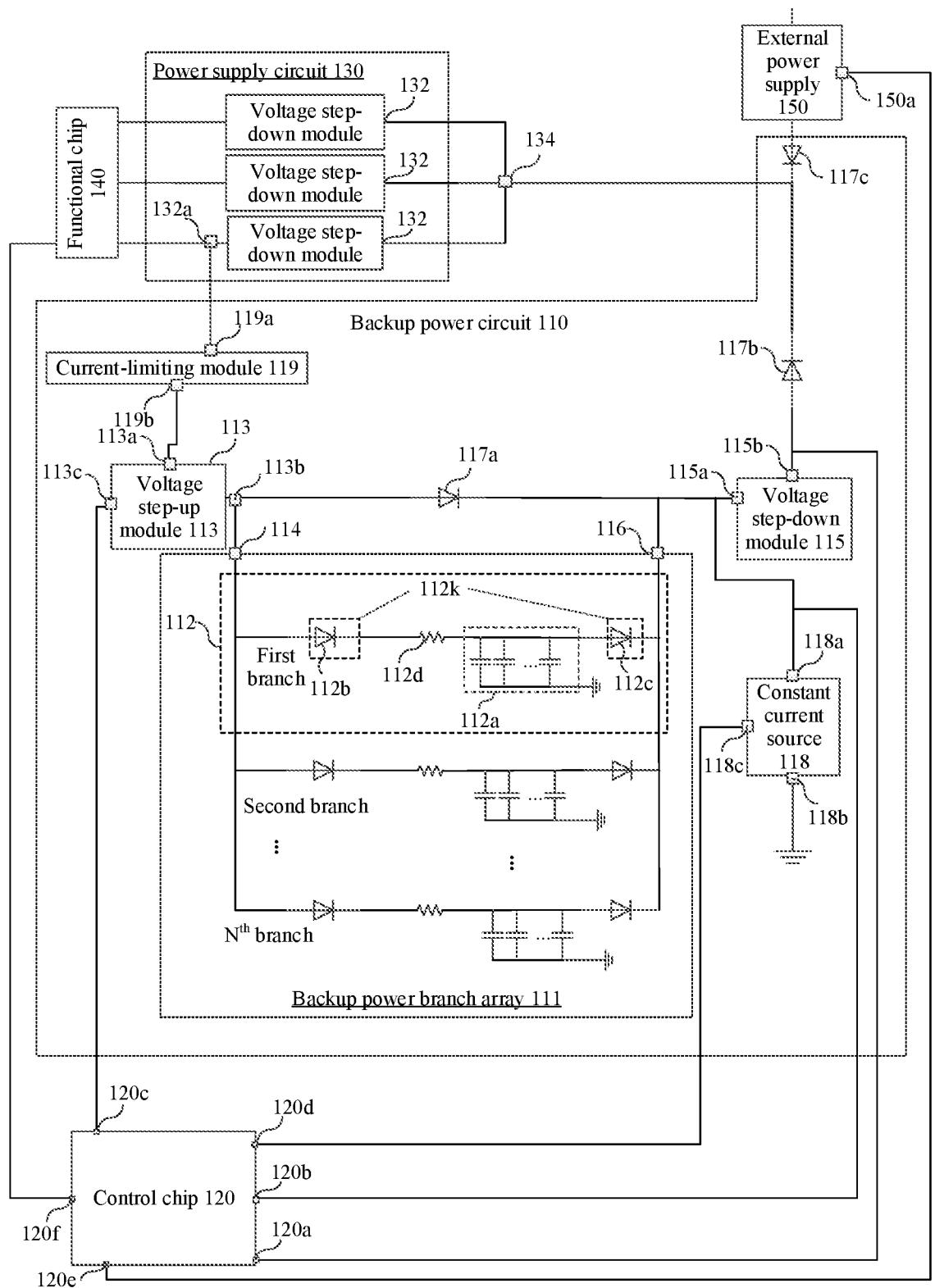
FIG. 1 is a circuit diagram of an electrical device according to an example embodiment of the present application.

Referring to FIG. 1, FIG. 1 is a circuit diagram of an electrical device according to an example embodiment of the present application. The electrical device includes a backup power circuit 110, a control chip 120, a power supply circuit 130, and a functional chip 140.

An output end of the backup power circuit 110 is electrically coupled to an input end of the power supply circuit 130 of the electrical device, an input end of the backup power circuit 110 is coupled to an output end of the power supply circuit 130, and the input end of the power supply circuit 130 is further electrically coupled to an output end of an external power supply 150. Typically, the electrical device may be a storage device, such as an SSD.

The backup power circuit 110 includes a backup power branch array 111 including N backup power branches 112 that are connected in parallel, where N is an integer greater than or equal to 2. Each backup power branch includes a capacitor component 112a and a unilateral conductive element 112k, where the unilateral conductive element 112k is electrically coupled to an input end 114 of the backup power branch array, an output end 116 of the backup power branch array, and the capacitor component 112a separately. The unilateral conductive element 112k is configured to cut off a current path between the N backup power branches 112 that are connected in parallel, that is, when a capacitor component 112a in a backup power branch 112 is short-circuited, electric energy stored in a capacitor component 112a in another backup power branch 112 cannot flow into the short-circuited backup power branch 112. In addition, the unilateral conductive element 112k allows a current to flow into the input end 114 of the backup power branch array and flow out from the output end 116 of the backup power branch array.

In another embodiment, the unilateral conductive element 112k includes a first diode 112b and a second diode 112c, each backup power branch 112 further includes a resistor 112d, and each capacitor component 112a includes M capacitors that are connected in parallel. One end of each capacitor is coupled between the resistor 112d and a positive electrode of the second diode 112c, the other end of each capacitor is grounded, and M is an integer greater than or equal to 1.

One end of the resistor 112d is electrically coupled to a negative electrode of the first diode 112b, the other end of the resistor 112d is electrically coupled to the positive electrode of the second diode 112c, a positive electrode of the first diode 112b is electrically coupled to the input end 114 of the backup power branch array 111, and a negative electrode of the second diode 112c is electrically coupled to the output end 116 of the backup power branch array 111. The first diode and the second diode are configured to cut off the current path between the N backup power branches that are connected in parallel.

In an embodiment of the present application, the unilateral conductive element 112k includes the first diode 112b and the second diode 112c. In actual application, the unilateral conductive element may include other element or structure. For example, in the unilateral conductive element, more diodes may be used to replace the first diode 112b and/or the second diode 112c. Alternatively, the first diode 112b and the second diode 112c in the unilateral conductive element may be replaced with other elements with similar functions as the diodes, such as an ionic tube, a rectifier, a silicon controlled thyristor with unilateral conductivity, or a unilateral conductive adhesive. No limitation is imposed on a composition and a structure of the unilateral conductive element 112k in embodiments of the present application.

In actual application, each of the M capacitors that are coupled in parallel may be a capacitor having a voltage with a relatively high rating, such as an ordinary electrolytic aluminum capacitor, a polymer solid tantalum capacitor, a polymer solid aluminum capacitor, or a ceramic capacitor. The four capacitors are merely examples for description. The M capacitors that are coupled in parallel in embodiments of the present application may have voltages with relatively high ratings, however, no limitation is imposed on a type or selection of the capacitors in the present application.

In one embodiment, the control chip 120 is configured to: measure a capacitance of the backup power branch array 111 according to a preset period, determine whether a total capacitance is less than a first preset threshold, and if the total capacitance is less than the first preset threshold, generate prompt information indicating that duration for which the backup power circuit 110 can effectively supply power to the electrical device is less than a preset duration. For example, the control chip 120 may send the prompt information to a host device coupled to the electrical device.

In another embodiment, the backup power circuit 110 further includes a third diode 117a, a fourth diode 117b, and a fifth diode 117c. A positive electrode of the fifth diode 117c is coupled to the external power supply 150, and a negative electrode of the fourth diode 117b is electrically coupled to a negative electrode of the fifth diode 117c, to form a repelling structure, to prevent a current that flows out from the external power supply 150 from flowing into the backup power branch array 111 when the external power supply 150 works normally, and prevent a current that flows out from the backup power branch array 111 from flowing into the external power supply 150 when the external power supply 150 powers off.

Similarly, the third diode 117a, the fourth diode 117b, and the fifth diode 117c may alternatively have another element or structure. For example, in one embodiment, the third diode 117a, the fourth diode 117b, and the fifth diode 117c each may include a plurality of diodes. Alternatively, the third diode 117a, the fourth diode 117b, and the fifth diode 117c may be replaced with other elements with similar functions as the diodes, such as an ionic tube, a rectifier, a silicon controlled thyristor with unilateral conductivity, or a unilateral conductive adhesive.

In one embodiment, the input end 134 of the power supply circuit 130 is electrically coupled to the negative electrode of the fourth diode 117b and the negative electrode of the fifth diode 117c. The power supply circuit 130 includes a plurality of voltage step-down modules 132, and each voltage step-down module 132 correspondingly supplies power to one or more functional chips 140. The voltage step-down module 132 in the power supply circuit 130 is set, according to an electrical requirement of a functional chip 140 corresponding to the voltage step-down module 132, to output different voltage values. For example, these output voltage values may be 1.0 V, 1.8 V, 3.3 V, 5.6 V, 6.8 V, or the like. The foregoing values are merely used as examples to describe voltage values that can be output by the voltage step-down module 132 in the power supply circuit 130, and impose no limitation on a voltage value output by the voltage step-down module 132 in the power supply circuit 130.

As shown in FIG. 1, in one embodiment, the backup power circuit 110 further includes a voltage step-up module 113, a voltage step-down module 115, a constant current source 118, and a current-limiting module 119. The current-limiting module 119 includes an input end 119a and an output end 119b, the voltage step-up module 113 includes an input end 113a, an output end 113b, and a control end 113c, the voltage step-down module 115 includes an input end 115a and an output end 115b, and the constant current source 118 includes a current input end 118a, a current output end 118b, and a control end 118c. The control chip 120 includes at least a first interface 120a, a second interface 120b, a third interface 120c, a fourth interface 120d, a fifth interface 120e, and a sixth interface 120f.

In one embodiment, an output end 132a of a voltage step-down module 132 in the power supply circuit 130 is electrically coupled to the input end 119a of the current-limiting module 119, the output end 119b of the current-limiting module 119 is electrically coupled to the input end 113a of the voltage step-up module 113, the output end 113b of the voltage step-up module 113 is electrically coupled to the input end 114 of the backup power branch array 111 and a positive electrode of the third diode 117a separately, and the control end 113c of the voltage step-up module 113 is electrically coupled to the third interface 120c of the control chip 120. The input end 115a of the voltage step-down module 115 is electrically coupled to a negative electrode of the third diode 117a and the output end 116 of the backup power branch array 111 separately, the output end 115b of the voltage step-down module 115 is electrically coupled to a positive electrode of the fourth diode 117b and the first interface 120a of the control chip 120 separately, the current input end 118a of the constant current source 118 is electrically coupled to the second interface 120b of the control chip 120 and the output end 116 of the backup power branch array 111 separately, the current output end 118b of the constant current source 118 is grounded, the control end 118c of the constant current source 118 is electrically coupled to the fourth interface 120d of the control chip 120, and the fifth interface 120e of the control chip 120 is electrically coupled to a control end 150a of the external power supply. The sixth interface 120f of the control chip 120 is a power supply interface of the control chip 120.

The current-limiting module 119 can be configured to limit a current entering the voltage step-up module 113 below a preset maximum current. That is, a value of the current entering the backup power circuit 110 is limited, to prevent the foregoing components from being burned due to an excessive current, thereby providing current-limiting protection for the backup power circuit 110, the voltage step-up module 113, the voltage step-down module 115, the third diode 117a, and the fourth diode 117b. The current-limiting module 119 may be a current-limited circuit module.

The voltage step-up module 113 can be configured to step up a voltage of the voltage step-up module 113, so as to increase electric energy that can be charged into capacitors in the N backup power branches 112 that are coupled in parallel (a higher voltage of a capacitor indicates more electric charges in the capacitor). The voltage step-up module 113 may be a switch direct current boost circuit module.

The voltage step-down module 115 can configured to: when the backup power circuit 110 supplies power to the electrical device, step down a voltage of the backup power branch array 111 and output a voltage obtained after the voltage step-down to the voltage step-down modules 132 in the power supply circuit 130. Then the voltage step-down modules 132 perform secondary voltage step-down and transport a voltage obtained after the secondary voltage step-down to the functional chips 140. The voltage step-down module 115 may be a buck conversion circuit module.

The constant current source 118 can configured to provide a constant current output path for the output end 116 of the backup power branch array 111, so that the control chip 120 measures a capacitance of the backup power branch array 111.

The control chip 120 can collect, using the first interface 120*a*, a voltage that is at the output end 116 of the backup power branch array 111 and that is obtained after voltage step-down by the voltage step-down module 115. The first interface 120*a* may be an analog-to-digital converter (ADC) interface in the control chip 120.

The control chip 120 can detect a voltage at the input end of the constant current source 118 using the second interface 120*b*, and the second interface 120*b* may be another ADC interface in the control chip 120.

The control chip 120 can control, using the third interface 120*c*, running of the voltage step-up module 113, including controlling enabling and disabling of the voltage step-up module 113. The third interface may be a general purpose input/output (GPIO) interface in the control chip 120.

The control chip 120 can control, using the fourth interface 120*d*, running of the constant current source 118, including controlling enabling and disabling of the constant current source 118. The fourth interface may be another general purpose input/output interface in the control chip 120.

The control chip 120 can detect, using the fifth interface 120*e*, a voltage value provided by the external power supply 150 for the electrical device. When the voltage value is less than a preset power supply voltage, the control chip 120 considers that the external power supply 150 is in a power-off state. The fifth interface 120*e* may be an INT interface in the control chip 120.

The functional chips 140 can include at least a clock chip, a flash memory (Flash EEPROM Memory or Flash) chip, a main memory (Double Data Rate, DDR) chip, and the like. The functional chips are merely used as an example for describing some of chips that need to obtain electric energy for working. Other functional chips in the electrical device that require electric energy for working also fall within the protection scope of the functional chips 140. All functional chips 140 are disposed, according to different rated voltages for working of the functional chips 140, to be coupled to output ends of corresponding voltage step-down modules 132.

Figure 2:
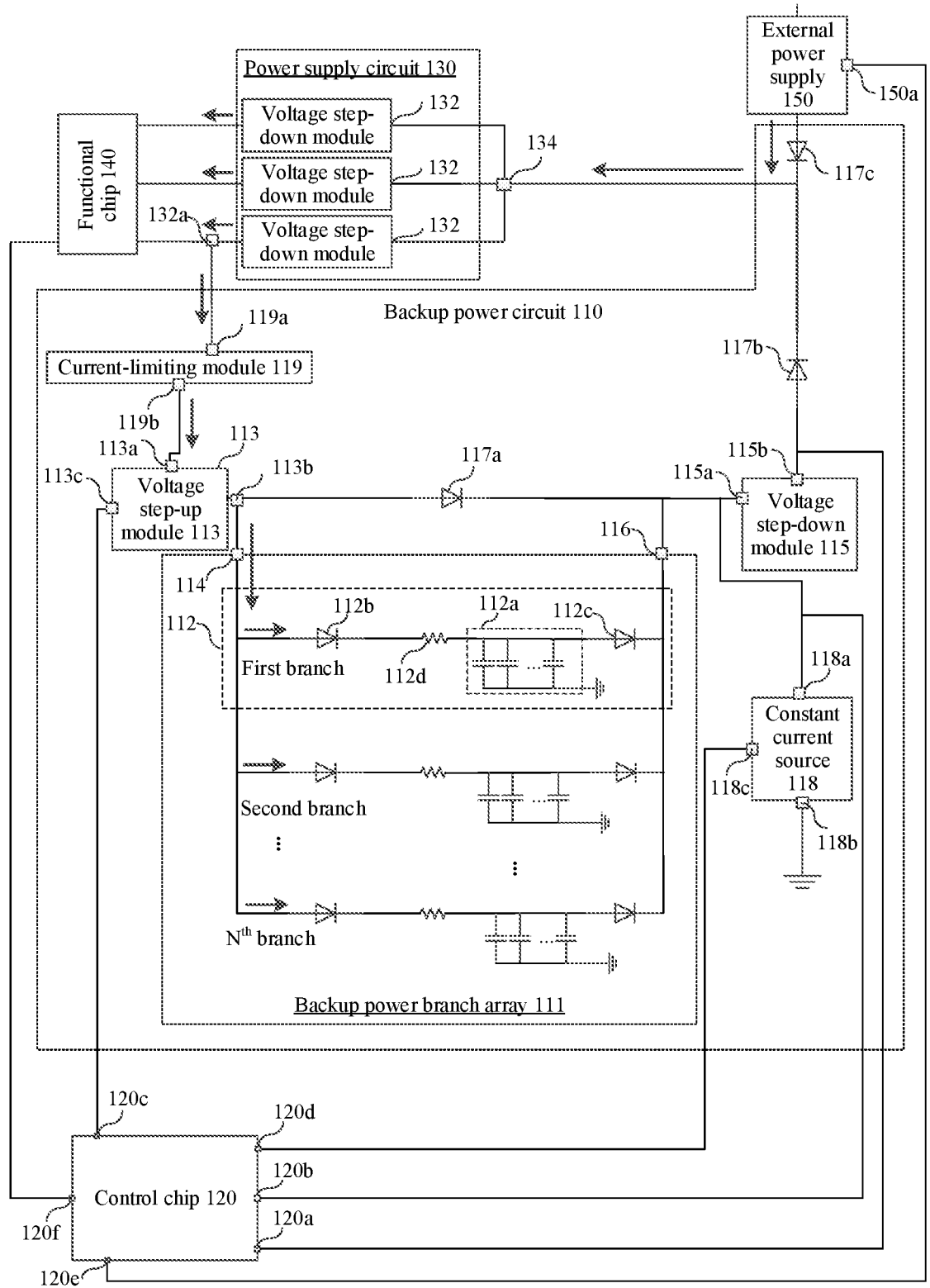
FIG. 2 is a schematic diagram of a flow direction of a current when a backup power circuit is being charged according to the embodiment corresponding to FIG. 1.

Referring to FIG. 2, FIG. 2 is a schematic diagram of a flow direction of a current when a backup power circuit is being charged according to an embodiment of the present application. As shown in FIG. 2, for example, the electrical device is a storage device, and when the storage device works normally, first the storage device accesses a host device. The host device may be an electronic device, such as a personal computer, a workstation, a server, or a server cluster, that can perform a read/write operation on the storage device. After the storage device accesses the host device, the storage device obtains electric energy from an external power supply 150 provided by the host device. After the storage device obtains the electric energy, a current provided by the external power supply 150 flows into a fifth diode 117*c*, and the current flows out in two branches: One branch flows into and stops at a negative electrode of a fourth diode 117*b*. The other branch is divided into branches whose quantity corresponds to a quantity of voltage step-down modules 132 in a power supply circuit 130, and the branches respectively flow into the corresponding voltage step-down modules 132. The branches of currents flowing into the corresponding voltage step-down modules 132 are respectively converted into output currents of different voltages after the branches of currents are stepped down, and the output currents flow into functional chips 140 (and a control chip 120) electrically coupled to the corresponding voltage step-down modules 132. After obtaining electric energy, in one embodiment, the control chip 120 is reset, and loads firmware (FW). In addition, the functional chips 140 can also start to work normally after the obtaining of the electric energy and completing the reset for the control chip 120. The storage device then starts normal operations of reading/writing of data and data exchanges with the host device.

In addition, a current output by an output end 132*a* of the voltage step-down module 132 in the power supply circuit 130 and that is electrically coupled to an input end 119*a* of a current-limiting module 119 enters the current-limiting module 119, and flows into a voltage step-up module 113 using an input end 113*a* of the voltage step-up module 113. The voltage step-up module 113 is in an enabled state by default, or the voltage step-up module 113 may be enabled by means of controlling by the control chip 120 using a control end 113*c*. When the voltage step-up module 113 is in the enabled state, the voltage step-up module 113 steps up a voltage at the input end 113*a* of the voltage step-up module 113, so that the voltage rises to a predefined value based on a design requirement. The predefined value may be related to a rated voltage of a capacitor in each backup power branch 112. In one embodiment, 70% to 80% of the rated voltage may be equal to Vcap, and the Vcap value may be 17.8 V. In this embodiment of the present application, the value of the 17.8 V voltage is merely used as an example for description, and imposes no limitation on Vcap. Vcap can be a charge voltage when each backup power branch 112 is being charged.

After the voltage step-up module 113 is enabled, the current flowing into the voltage step-up module 113 can flow out from an output end 113*b* of the voltage step-up module 113 and be divided into two branches: One branch flows into an input end 114 of a backup power branch array 111, and the other branch flows into a positive electrode of a third diode 117*a*. A current flowing into the input end 114 of the backup power branch array 111 is used to charge capacitors in N backup power branches 112.

It should be noted that a constant current source 118 can be in a non-working state before an enabling command that is sent by the control chip 120 using a fourth interface 120*d* is obtained. That is, the constant current source 118 is in an open-circuited state.

As a voltage at an input end 115*a* of a voltage step-down module 115 gradually rises to a minimum working voltage of the voltage step-down module 115, the voltage step-down module 115 enters a normal working state and is automatically enabled. It should be specially noted that a voltage output by the voltage step-down module 115 needs to be less than a power supply voltage provided by the external power supply 150, and greater than a minimum working voltage of the voltage step-down modules 132 in the power supply circuit 130. In another embodiment, the minimum working voltage may be 1 V. A value of the voltage $V_{standby}$ that needs to be output by the voltage step-down module 115 may be 6.8 V, and the value imposes no limitation on the voltage that needs to be output by the voltage step-down module 115. In this case, because the external power supply 150 supplies power normally, the voltage output by the voltage step-down module 115 is less than the power supply voltage provided by the external power supply 150. Therefore, the voltage step-down module 115 does not output a current to the voltage step-down modules 132 in the power supply circuit 130 using the fourth diode 117*b*.

Figure 3:
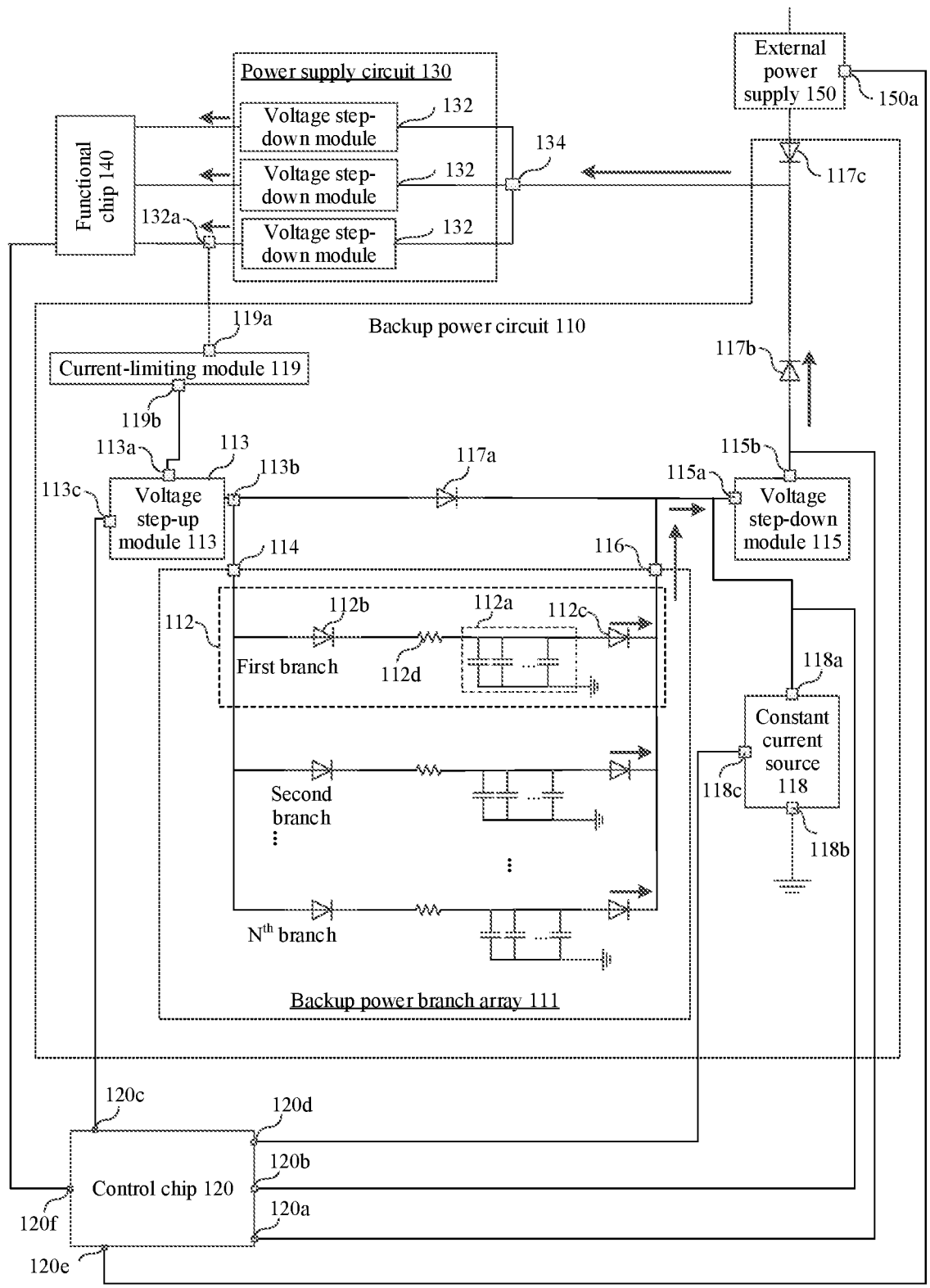
FIG. 3 is a schematic diagram of a flow direction of a current when a backup power circuit is being discharged according to the embodiment corresponding to FIG. 1.

Referring to FIG. 3, FIG. 3 is a schematic diagram of a flow direction of a current when a backup power circuit is being discharged according to an embodiment of the present application. As shown in FIG. 3, a voltage step-down module 115 electrically coupled to a positive electrode of a fourth diode 117b is always in a working state. When a voltage at a positive electrode of a fifth diode 117c is less than a voltage at the positive electrode of the fourth diode 117b (when an external power supply 150 is powered off), electric energy stored in the backup power circuit 110 instantly passes through a negative electrode of the fourth diode 117b, and flows, in a form of a current, into voltage step-down modules 132 in a power supply circuit 130, until a voltage of a capacitor in a backup power branch array 111 is less than a minimum working voltage of the voltage step-down module 115, so as to ensure that an electrical device (such as a storage device) can further work normally for a period of time using the electric energy stored in the backup power circuit.

In FIG. 3, the backup power circuit 110 is divided into N backup power branches 112 (which are denoted as "first branch", "second branch", . . . , and "$N^{th}$ branch" in FIG. 3), and each backup power branch 112 includes M capacitors. It is assumed that a capacitor in a backup power branch 112 is short-circuited. For example, in FIG. 3, a short-circuited capacitor is located in the $N^{th}$ backup power branch. Because M capacitors in one branch are coupled in parallel, capacitors in any one of the backup power branch may be short-circuited, and electric energy stored by the $N^{th}$ backup power branch 112 may be lost. However, due to existence of a first diode 112b and a second diode 112c, electric energy in other backup power branches 112 cannot enter the $N^{th}$ backup power branch 112. Therefore, the other backup power branches 112 can function normally, e.g., have a backup power effect. In addition, the first diode 112b can further prevent a current from flowing back into a voltage step-up module 113 from the backup power branch 112 when the external power supply 150 is powered off. In addition, in order to avoid leakage of a large quantity of currents from a short-circuited capacitor when the capacitor is short-circuited, a resistance of a resistor 112d needs to be set to be large enough, so that when a capacitor in the $N^{th}$ backup power branch 112 is short-circuited, a current passing through the resistor 112d in the $N^{th}$ backup power branch 112 is small enough, so as to minimize impact of electric leakage caused by the short-circuited capacitor. The resistance of the resistor 112d needs to satisfy (Vcap/R)*N<A0−A1. A0 is a maximum charge current of the backup power circuit, the maximum charge current may be a preset maximum current determined by a current-limiting module 119, and A1 is a preset current value. In one embodiment, A1 may be a value greater than 10 mA.

It should be noted that there are N backup power branches as disclosed in the present application, and the N backup power branches include some redundant backup power branches. That is, when the external power supply 150 is powered off, to meet a maximum backup power requirement of the electrical device, a number of backup power branches less than N backup power branches is needed for the circuit to work normally. That is, only (N−x) backup power branches may be required for normal operation, or to meet the maximum backup power requirement of the electrical device, where x is an integer greater than or equal to 1, x is a quantity of redundant backup power branches, and a value of N should not be excessively large. In one embodiment, a value of N is 10. The disclosed value imposes no limitation on the value of N in embodiments of the present application.

Specifically, if (N−x) backup power branches work normally, the maximum backup power requirement of the electrical device can be met, when capacitances of the capacitors in the backup power circuit are equal, a capacitance of each capacitor is Cmin, and Cmin satisfies Cmin*M*(N−x)*(Vmax−Vmin)≥Q, where x is an integer greater than or equal to 1, Vmax is a maximum discharge voltage of the backup power branch array, Vmin is a minimum discharge voltage of the backup power branch array, and Q is a quantity of electric charges required for effectively supplying power to the electrical device for preset duration. Vmax may be the foregoing Vcap, and Vmin may be the foregoing $V_{standby}$.

Figure 4:
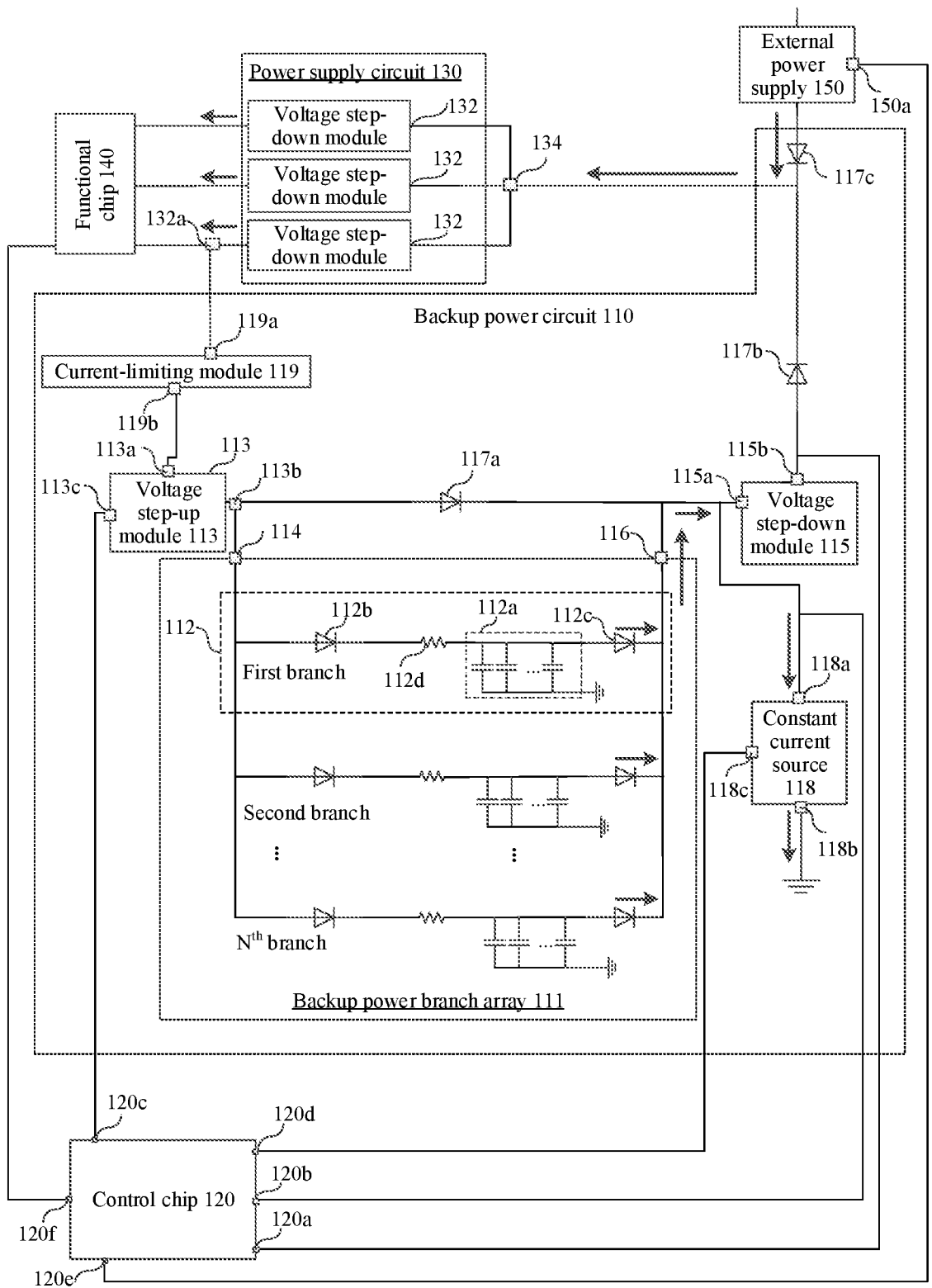
FIG. 4 is a schematic diagram of a flow direction of a current when a backup power circuit performs a self-test according to the embodiment corresponding to FIG. 1.

In an embodiment of the present application, the control chip 120 may detect a capacitance of the backup power branch array 111 by controlling discharge of a constant current source 118, so as to implement a self-test of the backup power circuit. Referring to FIG. 4, FIG. 4 is a schematic diagram of a flow direction of a current when a backup power circuit performs a self-test according to an embodiment of the present application. In one embodiment, when detecting a capacitance of a backup power branch array 111, a control chip 120 controls the backup power circuit 110 to stop charging, and controls a constant current source 118 to discharge at a constant current I0. For example, the control chip 120 may control, using a third interface 120c, a voltage step-up module 113 to stop outputting of a current, so as to stop charging the backup power circuit 110. Then the control chip 120 controls, using a fourth interface 120d, the constant current source 118 to be enabled, so that the backup power circuit 110 discharges at the constant current I0 using a branch in which the constant current source 118 is located.

In a process in which the backup power circuit 110 discharges at the constant current I0 using the branch in which the constant current source 118 is located, the control chip 120 detects a voltage at a current input end 118a of the constant current source 118 using a second interface 120b. Because the current input end 118a of the constant current source 118 is electrically coupled to an output end 116 of the backup power branch array 111, equivalently, the control chip 120 detects a voltage at the output end 116 of the backup power branch array 111 using the second interface 120b. In an embodiment of the present application, two voltage values, that is, a first preset voltage value V1 and a second preset voltage value V2 may be preset. The control chip 120 measures a time T0 taken for the voltage at the current input end 118a of the constant current source 118 to decrease from the first preset voltage value V1 to the second preset voltage value V2, and V1 is greater than V2. In this case, in the backup power circuit 110, the capacitance of the backup power branch array 111 satisfies C=I0*T0/(V1−V2). In an actual operation, values of V1 and V2 may be selected according to an easy-to-obtain and error reduction rule.

In one embodiment, a value of V1 may be (Vcap−500 mV), and a value of V2 may be (Vcap−1000 mV). A value of Vcap is a voltage at the output end 116 of the backup power branch array 111 after charging of the backup power circuit 110 is completed, that is, a voltage value at an output end 113b of the voltage step-up module 113 when the voltage step-up module 113 is enabled. After the measurement is completed, the control chip 120 can disable the constant current source 118 using the fourth interface 120d, so that the constant current source 118 is open-circuited. In addition, the control chip 120 can enable the voltage step-up module 113 using the third interface 120c, to control the voltage step-up module 113 to continue to charge the backup power branch array 111. In this case, an electrical device completes measurement of the capacitance of the backup power branch array 111, and the backup power circuit 110 returns to a normal backup power state.

That a backup power branch 112 is in an effective working state means that none of M capacitors in the backup power branch 112 is short-circuited.

Thus, according to the electrical device provided in the foregoing embodiment, the backup power branch array including the N backup power branches that are coupled in parallel is disposed in the backup power circuit. The control chip of the electrical device measures the capacitance of the backup power branch array; determines whether the capacitance is less than the first preset threshold; and if the capacitance is less than the first preset threshold, notifies that the duration for which the backup power circuit can effectively supply power to the electrical device is less than a preset duration. A plurality of backup power branches are disposed in the backup power circuit, and the capacitance of the backup power branch array in the backup power circuit is detected regularly. When some backup power branches are short-circuited, a user can be reminded in a timely manner, so that the user takes a necessary remedial measure before the backup power circuit totally fails, thereby improving a backup power effect of the backup power circuit.

It should be understood that, unless an exception is specified clearly in the context, a singular form "one" ("a", "an" or "the") used in this specification is intended to also include a plural form. It should be further understood that "and/or" used in this specification is any or all possible combinations including one or more listed related items.

The sequence numbers of the foregoing embodiments of the present application are merely for illustration purposes, and are not intended to indicate priorities of the embodiments.

A person of ordinary skill in the art may understand that all or some of the steps of the embodiments may be implemented by hardware or a program instructing relevant hardware. The program may be stored in a computer-readable storage medium. The foregoing mentioned storage medium may include a read-only memory, a disk, an optical disc, or the like.

The foregoing descriptions are merely example embodiments of the present application, but are not intended to limit the present application. Any modification, equivalent replacement, and improvement made without departing from the spirit and principle of the present application shall fall within the protection scope of the present application.

What is claimed is:

1. A backup power circuit, wherein an output end of the backup power circuit is coupled to an input end of a power supply circuit of an electrical device, an input end of the backup power circuit is coupled to an output end of the power supply circuit, the backup power circuit comprises:
    a backup power branch array comprising N backup power branches that are coupled in parallel, N is an integer greater than or equal to 2, and each backup power branch comprise a capacitor component and a unilateral conductive element, wherein
    the unilateral conductive element is coupled to an input end of the backup power branch array, an output end of the backup power branch array, and the capacitor component separately; and
    the unilateral conductive element is configured to: cut off a current path between the N backup power branches that are coupled in parallel, and allow a current to flow into the input end of the backup power branch array and flow out from the output end of the backup power branch array.

2. The backup power circuit according to claim 1, wherein the unilateral conductive element comprises a first diode and a second diode, and wherein
    a negative electrode of the first diode is coupled to a positive electrode of the second diode, a positive electrode of the first diode is coupled to the input end of the backup power branch array, and a negative electrode of the second diode is coupled to the output end of the backup power branch array; and the capacitor component comprises M capacitors that are coupled in parallel, one end of each capacitor is coupled between the negative electrode of the first diode and the positive electrode of the second diode, the other end of each capacitor is grounded, and M is an integer greater than or equal to 1.

3. The backup power circuit according to claim 2, wherein a capacitance of each capacitor is Cmin, and Cmin satisfies Cmin*M*(N−x)*(Vmax−Vmin)≥Q, wherein
    x is an integer greater than or equal to 1, Vmax is a maximum discharge voltage of the backup power branch array, Vmin is a minimum discharge voltage of the backup power branch array, and Q is a quantity of electric charges required for effectively supplying power to a storage device for a preset duration.

4. The backup power circuit according to claim 2, wherein each backup power branch further comprise a resistor, one end of the resistor is electrically coupled to the negative electrode of the first diode, and the other end of the resistor is coupled to the positive electrode of the second diode; and one end of each capacitor is coupled between the resistor and the positive electrode of the second diode.

5. The backup power circuit according to claim 4, wherein a resistance R of the resistor satisfies:

(Vcap/R)*N<A0−A1, where

Vcap is a charge voltage of the N backup power branch that are coupled in parallel, A0 is a maximum charge current of the backup power circuit, and A1 is a preset current value.

6. The backup power circuit according to claim 1, wherein the backup power circuit further comprises a third diode; and
    the third diode is coupled to the backup power branch array in parallel, wherein a positive electrode of the third diode is coupled to the input end of the backup power branch array, and a negative electrode of the third diode is coupled to the output end of the backup power branch array.

7. The backup power circuit according to claim 1, wherein the backup power circuit further comprises a constant current source;
    the constant current source comprises an input end, an output end, and a control end;
    the input end of the constant current source is coupled to the output end of the backup power branch array;
    the output end of the constant current source is grounded; and
    the control end of the constant current source is coupled to a control chip.

8. The backup power circuit according to claim 1, wherein each of the M capacitors that are coupled in parallel is at least one of an electrolytic aluminum capacitor, a polymer solid tantalum capacitor, a polymer solid aluminum capacitor, or a ceramic capacitor.

9. An electrical device, wherein the electrical device comprises a backup power circuit, wherein an output end of the backup power circuit is coupled to an input end of a power supply circuit of the electrical device, an input end of the backup power circuit is coupled to an output end of the power supply circuit, the backup power circuit comprises:

a backup power branch array comprising N backup power branches that are coupled in parallel, N is an integer greater than or equal to 2, and each backup power branch comprise a capacitor component and a unilateral conductive element, wherein the unilateral conductive element is coupled to an input end of the backup power branch array, an output end of the backup power branch array, and the capacitor component separately; and the unilateral conductive element is configured to: cut off a current path between the N backup power branches that are coupled in parallel, and allow a current to flow into the input end of the backup power branch array and flow out from the output end of the backup power branch array.

10. The electrical device according to claim 9, wherein the unilateral conductive element comprises a first diode and a second diode; and a negative electrode of the first diode is coupled to a positive electrode of the second diode, a positive electrode of the first diode is coupled to the input end of the backup power branch array, and a negative electrode of the second diode is coupled to the output end of the backup power branch array; and the capacitor component comprises M capacitors that are coupled in parallel, one end of each capacitor is coupled between the negative electrode of the first diode and the positive electrode of the second diode, the other end of each capacitor is grounded, and M is an integer greater than or equal to 1.

11. The electrical device according to claim 10, wherein a capacitance of each capacitor is Cmin, and Cmin satisfies Cmin*M*(N−x)*(Vmax−Vmin)≥Q, wherein x is an integer greater than or equal to 1, Vmax is a maximum discharge voltage of the backup power branch array, Vmin is a minimum discharge voltage of the backup power branch array, and Q is a quantity of electric charges required for effectively supplying power to a storage device for a preset duration.

12. The electrical device according to claim 10, wherein each backup power branch further comprise a resistor, one end of the resistor is coupled to the negative electrode of the first diode, and the other end of the resistor is coupled to the positive electrode of the second diode; and one end of each capacitor is coupled between the resistor and the positive electrode of the second diode.

13. The electrical device according to claim 12, wherein a resistance R of the resistor satisfies:

$(Vcap/R)*N < A0 - A1$, where

Vcap is a charge voltage of the N backup power branch that are coupled in parallel, A0 is a maximum charge current of the backup power circuit, and A1 is a preset current value.

14. The electrical device according to claim 9, wherein the backup power circuit further comprises a third diode; and the third diode is coupled to the backup power branch array in parallel, wherein a positive electrode of the third diode is coupled to the input end of the backup power branch array, and a negative electrode of the third diode is coupled to the output end of the backup power branch array.

15. The electrical device according to claim 9, wherein the backup power circuit further comprises a constant current source;

the constant current source comprises an input end, an output end, and a control end;

the input end of the constant current source is coupled to the output end of the backup power branch array;

the output end of the constant current source is grounded; and the control end of the constant current source is coupled to a control chip.

16. The electrical device according to claim 9, wherein each of the M capacitors that are coupled in parallel is at least one of an electrolytic aluminum capacitor, a polymer solid tantalum capacitor, a polymer solid aluminum capacitor, or a ceramic capacitor.

17. The electrical device according to claim 9, wherein the electrical device is a storage device.

* * * * *